United States Patent
Hou et al.

(10) Patent No.: US 8,049,647 B2
(45) Date of Patent: Nov. 1, 2011

(54) CAPACITIVE KEYBOARD DEVICE WITH A KEYSTROKE TRIGGERING THRESHOLD ADAPTIVELY ADJUSTABLE CAPABILITY

(75) Inventors: Chien-Ming Hou, Taipei (TW); Hui-Lung Chou, Taipei (TW)

(73) Assignee: Prospect Technology Corporation, Taipei (TW)

( * ) Notice: Subject to any disclaimer, the term of this patent is extended or adjusted under 35 U.S.C. 154(b) by 702 days.

(21) Appl. No.: 12/207,730

(22) Filed: Sep. 10, 2008

(65) Prior Publication Data

US 2009/0289818 A1    Nov. 26, 2009

(30) Foreign Application Priority Data

May 22, 2008    (TW) .............................. 97118958 A

(51) Int. Cl.
*H03M 11/00*    (2006.01)
*G06F 13/12*    (2006.01)
(52) U.S. Cl. .......................................... 341/33; 710/67
(58) Field of Classification Search .................... 341/33; 710/67
See application file for complete search history.

(56) References Cited

U.S. PATENT DOCUMENTS

| 6,993,607 B2 * | 1/2006 | Philipp ........................... 710/67 |
| 7,764,200 B2 * | 7/2010 | Lin ................................. 341/50 |

* cited by examiner

*Primary Examiner* — Michael Rutland Wallis
(74) *Attorney, Agent, or Firm* — Muncy, Geissler, Olds & Lowe, PLLC

(57) ABSTRACT

A capacitive keyboard device with a keystroke triggering threshold adaptively adjustable capability is proposed, which is designed for integration to an electronic unit, such as PDA (Personal Digital Assistant) computers, mobile phone unit, and calculator, for use as a data input device for the electronic unit. The proposed capacitive keyboard device is characterized by the operation of a triggering threshold adaptive adjustment function that can adaptively adjust the keystroke triggering threshold of the capacitive keyboard device in response to the user's habitual key-pressing action during each use, which also takes account of all internal factors (such as decay of the capacitor structure) and external factors (such as physical characteristics of the user's fingers). This feature allows the capacitive keyboard device to be reliable in operation for long period of use.

6 Claims, 4 Drawing Sheets

CAPACITIVE KEYBOARD DEVICE WITH A KEYSTROKE TRIGGERING THRESHOLD ADAPTIVELY ADJUSTABLE CAPABILITY

BACKGROUND OF THE INVENTION

1. Field of the Invention

This invention relates to electronic circuit technology, and more particularly, to a capacitive keyboard device which is designed for integration to an electronic unit, such as mobile phone or calculator, for use as a data input device, and which has a keystroke triggering threshold adaptively adjustable capability that can adaptively adjust the keystroke triggering threshold of the capacitive keyboard device.

2. Description of Related Art

Capacitive keyboards are a type of data input device that operates on a change in capacitance to determine whether a key has been pressed down by the user. This data input function is based on a compressible capacitor structure whose capacitance can be changed to a smaller value when compressed. Therefore, when a key is pressed down by the user, the capacitor will be compressed and thus reduced in capacitance, resulting in a change in the voltage charged on the capacitor, thus triggering the generation of a key strobe signal.

In construction, all the structural and electronic parts of a capacitive keyboard are covered under a thin plastic sheet. This feature allows the capacitive keyboard to be well protected against external contamination and abrasion. Moreover, since the capacitive keyboard has no moving parts as conventional mechanical-type of keyboard, it can be constructed with a smaller size. This feature allows capacitive keyboards to be particularly welcome and widely used on small-size portable devices.

In practical application, however, one drawback to the capacitive keyboard is that its keystroke triggering threshold to the user's key-pressing actions might be unreliable for long period of use, due to the reason that the rated capacitance of the capacitor structure might gradually decay to a smaller value by some internal and external factors, such as long time of use, abrasion, decay of the capacitor structure, temperature and humidity, and noise interferences. Moreover, the keystroke triggering threshold of the capacitive keyboard can also be influenced by various user factors, such as user's finger size, user's habitual key-pressing actions, and water or oil moistened on the user's finger.

All of the above-mentioned factors would affect the keystroke triggering threshold of a capacitive keyboard. There exists therefore a need in the electronic industry for a new technology that can adaptively adjust the keystroke triggering threshold of the capacitive keyboard in despite of the influencing factors mentioned above.

SUMMARY OF THE INVENTION

It is therefore an objective of this invention to provide a capacitive keyboard device which can adaptively adjust the keystroke triggering threshold of the capacitive keyboard during each use.

The capacitive keyboard device with a keystroke triggering threshold adaptively adjustable capability according to the invention is designed for integration to an electronic unit, such as PDA (Personal Digital Assistant) computer, mobile phone, calculator, measurement instrument, to name just a few, for use as a data input device keys for the electronic unit.

In architecture, the capacitive keyboard device of the invention comprises: (A) a capacitive keystroke-sensing module; (B) a keystroke mode detection module; (C) a signal differentiation module; (D) a negative-slope detection module; (E) a triggering threshold setting module; and (F) a key strobe signal generation module.

The capacitive keyboard device of the invention is characterized by the operation of a triggering threshold adaptive adjustment function that can adaptively adjust the keystroke triggering threshold of the capacitive keyboard device in response to the user's habitual key-pressing action during each use, which also takes account of all internal factors (such as decay of the capacitor structure) and external factors (such as physical characteristics of the user's fingers). This feature allows the capacitive keyboard device to be reliable in operation for long period of use.

The capacitive keyboard device with a keystroke triggering threshold adaptively adjustable capability according to the invention is disclosed in full details by way of preferred embodiments in the following with reference to the accompanying drawings.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Application of the Invention

Figure 1:
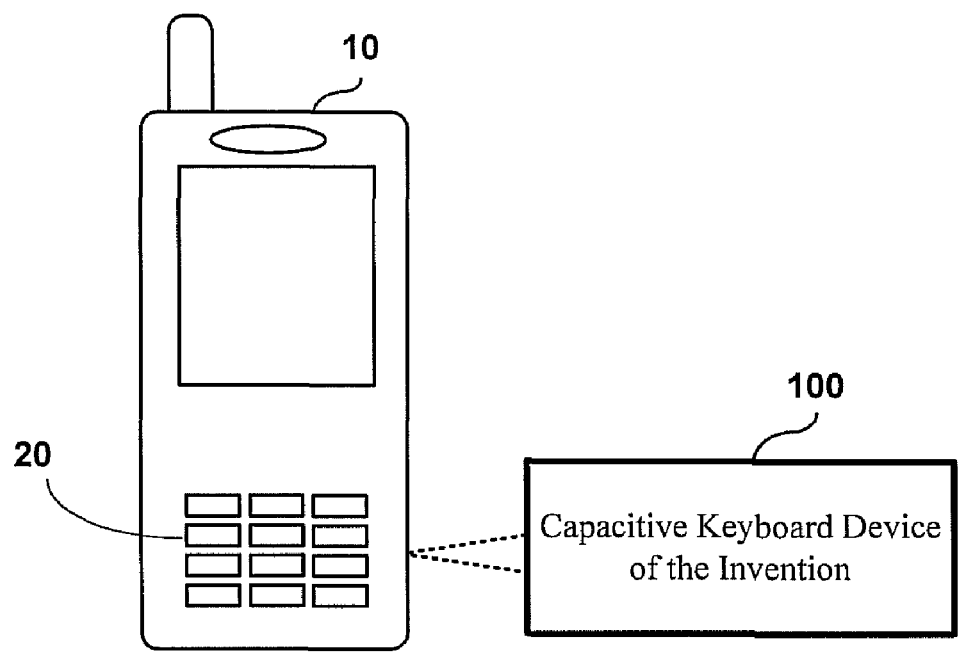
FIG. 1 is a schematic diagram showing an application example of the invention.

FIG. 1 is a schematic diagram showing an application example of the capacitive keyboard device with a keystroke triggering threshold adaptively adjustable capability according to the invention (which is here encapsulated in a box indicated by the reference numeral 100). As shown, the capacitive keyboard device of the invention 100 is designed for integration to an electronic unit 10, such as PDA (Personal Digital Assistant) computer, mobile phone, calculator, measurement instrument, to name just a few, for use in conjunction with a printed pattern of keys 20 (i.e., icons of keys printed on a plastic sheet) to serve as a data input device for the electronic unit 10.

Function of the Invention

Figure 2:
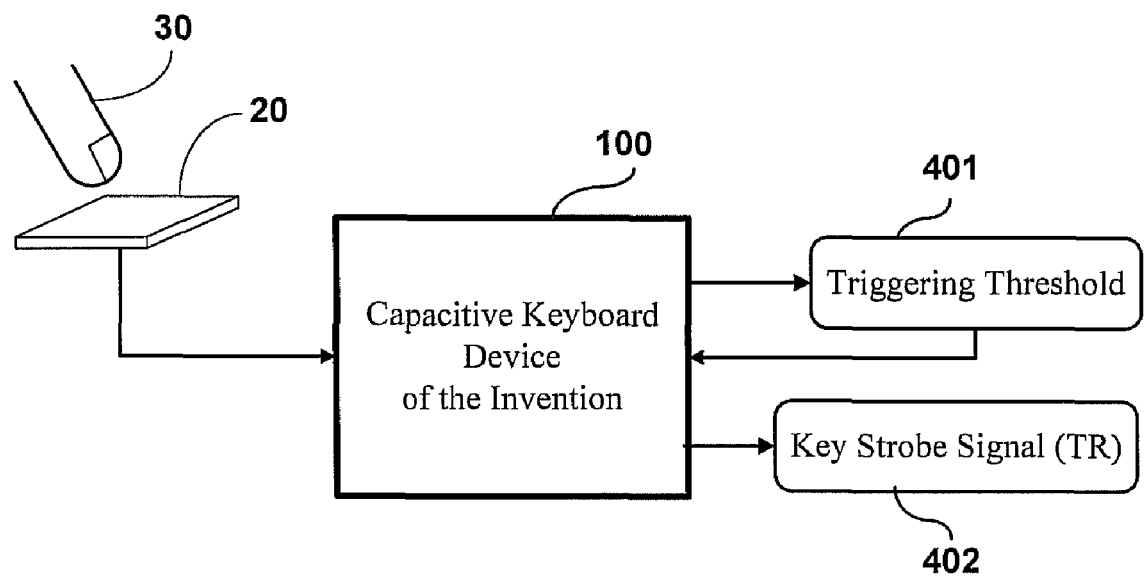
FIG. 2 is a schematic diagram showing the functional model of the invention.

FIG. 2 is a schematic diagram showing the functional model of the capacitive keyboard device of the invention 100. As shown, the capacitive keyboard device of the invention 100 is capable of performing an adaptive keystroke-triggering threshold adjusting function in response to the habitual mode of the user's key-pressing actions (i.e., whether the user presses the key 20 in a forceful manner or a lightly-touch manner) when the key 20 is pressed by the user 30 for the first time during each use. In operation, the capacitive keyboard device of the invention 100 will respond to each user-initiated keystroke event 401 on the key 20 (i.e., in the event of the user pressing the key 20) by producing a corresponding key strobe signal (TR) 402 for data input to the electronic unit 10.

Architecture of the Invention

Figure 3:
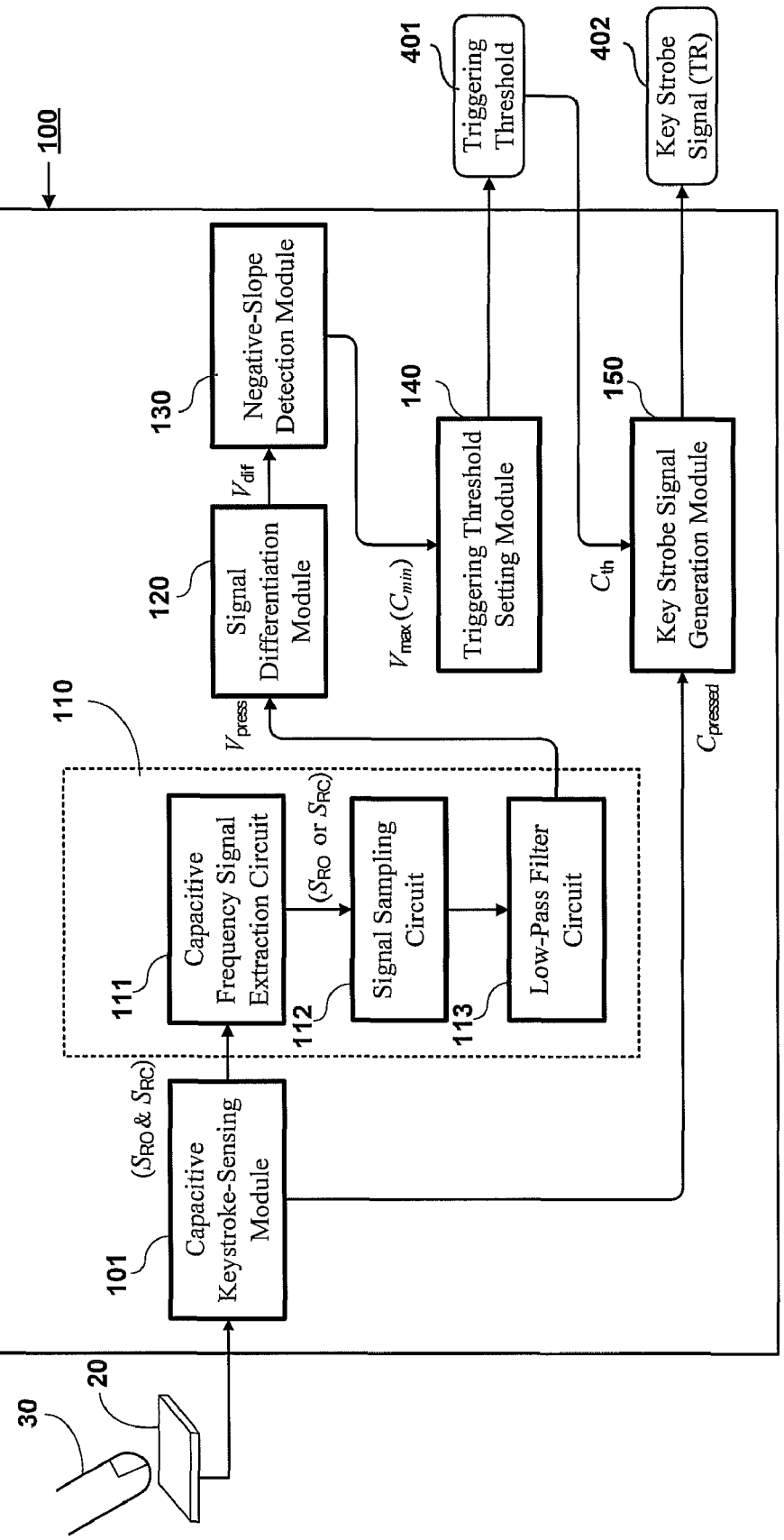
FIG. 3 is a schematic diagram showing the architecture of the invention.
Figure 4:
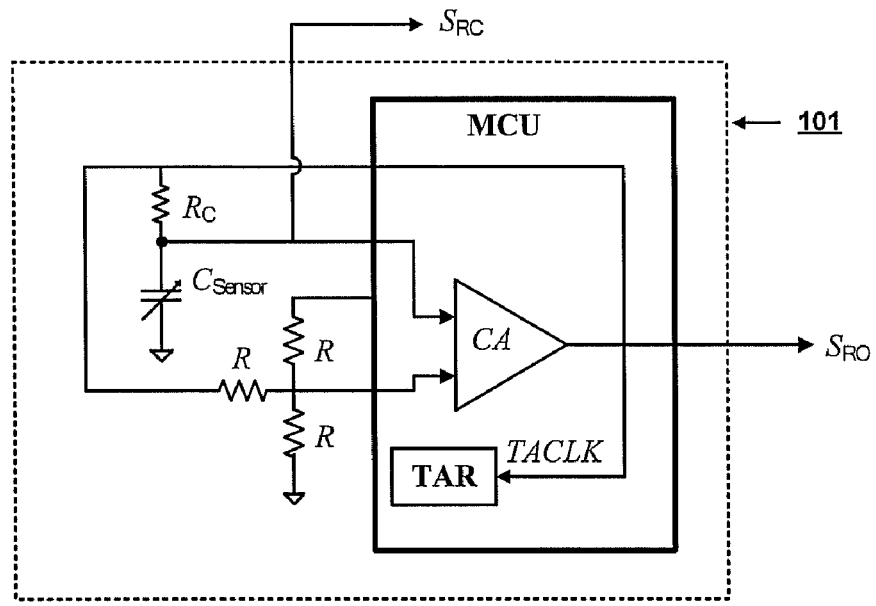
FIG. 4 is a schematic diagram showing the internal circuit architecture of a capacitive keystroke-sensing module utilized by the invention.

As shown in FIG. 3, in architecture, the capacitive keyboard device of the invention 100 comprises: (A) a capacitive keystroke-sensing module 101; (B) a keystroke mode detection module 110; (C) a signal differentiation module 120; (D) a negative-slope detection module 130; (E) a triggering threshold setting module 140; and (F) a key strobe signal generation module 150. Firstly, the respective attributes and functions of these constituent components of the invention are described in details in the following.

Capacitive Keystroke-Sensing Module 101

Figure 5A:
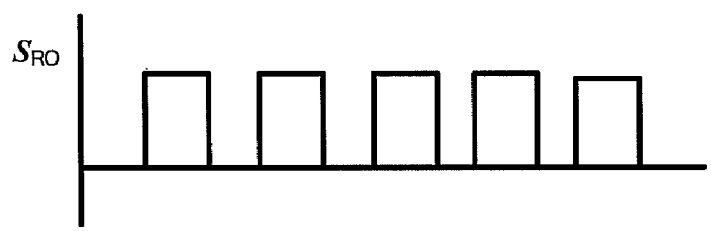
FIG. 5A is a signal diagram showing the waveform of a capacitive frequency signal ($S_{RO}$) extracted from the capacitive keystroke-sensing module shown in FIG. 4.
Figure 5B:
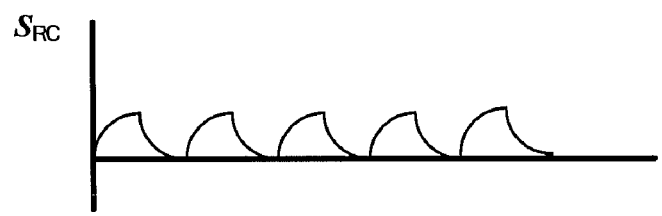
FIG. 5B is a signal diagram showing the waveform of another capacitive frequency signal ($S_{RC}$) extracted from the capacitive keystroke-sensing module shown in FIG. 4.

The capacitive keystroke-sensing module 101 is implemented with, for example, a relaxation oscillator (RO) based type of capacitive keystroke-sensing circuit. This RO-based capacitive keystroke-sensing circuit is a well-known and widely-utilized circuit component in capacitive keyboards, so that detailed description thereof will not be given in this specification. In operation, the RO-based capacitive keystroke-sensing module 101 is capable of responding to each keystroke action on the key 20 by internally generating two frequency signals: an RO-type capacitive frequency signal (represented by $S_{RO}$, whose waveform is shown in FIG. 5A) and an RC-type capacitive frequency signal (represented by $S_{RC}$, whose waveform is shown in FIG. 5B). The frequency or discharging time of $S_{RO}/S_{RC}$ is dependent on the compressed capacitance of the capacitive element ($C_{sensor}$) 102 in the capacitive keystroke-sensing module 101. Therefore, the compressed capacitance of the capacitive element ($C_{sensor}$) 102 resulted from the user's key-pressing action can be determined by measuring the frequency of the $S_{RO}/S_{RC}$ signal.

Keystroke Mode Detection Module 110

Figure 6:
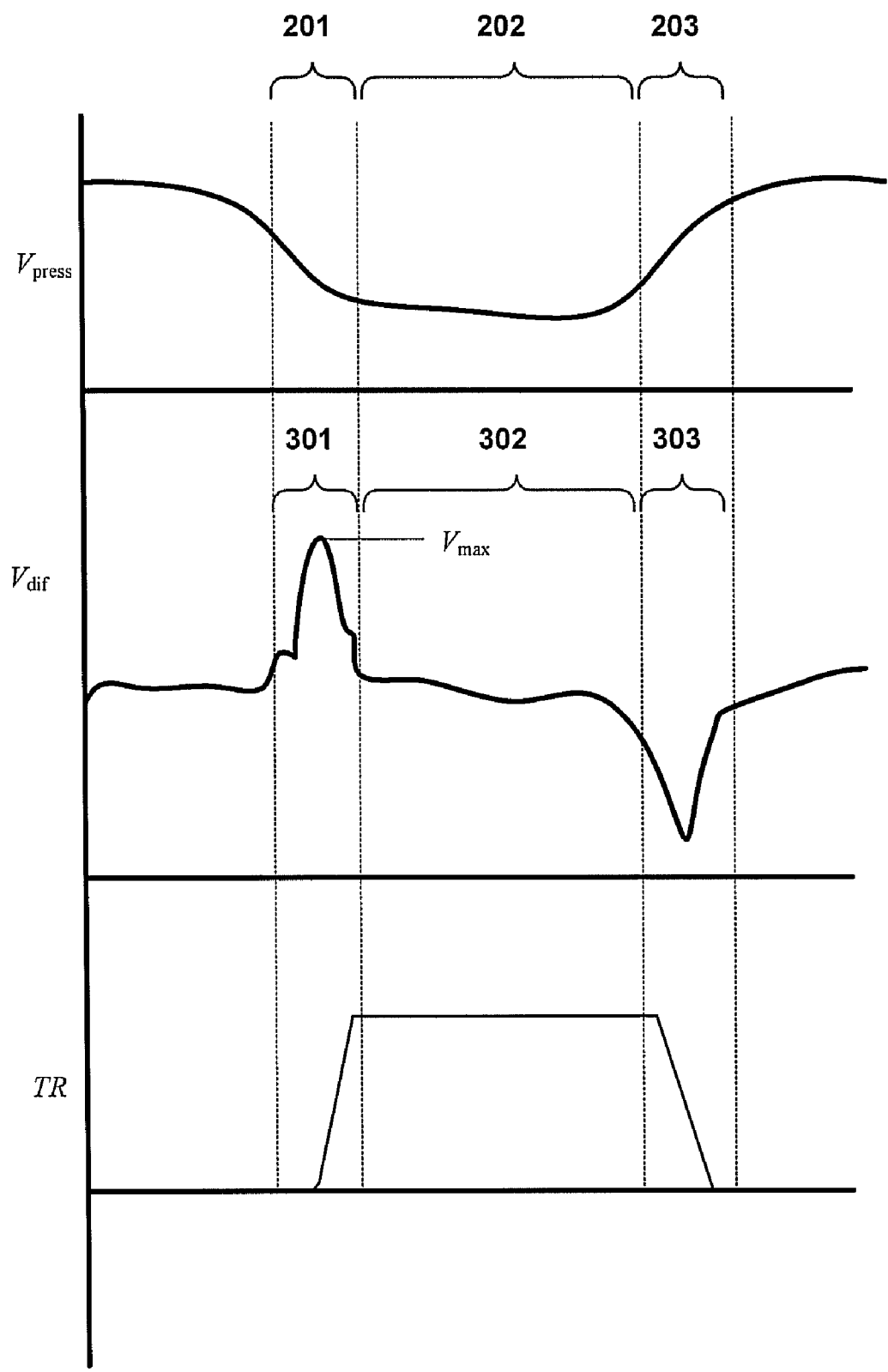
FIG. 6 is a signal diagram showing the waveform and sequencing of a set of signals ($V_{press}$, $V_{dif}$, TR) processed by the invention.

The keystroke mode detection module 110 is capable of processing the capacitive frequency signal ($S_{RO}$ or $S_{RC}$) extracted from the capacitive keystroke-sensing module 101 to thereby produce a keystroke mode description signal (represented by $V_{press}$) whose waveform can be used to indicate the keystroke mode of the user's key-pressing action. One example of the waveform of the keystroke mode description signal $V_{press}$ is illustrated in FIG. 6, which reveals the habitual keystroke mode of the user's key-pressing action (i.e., whether the user presses the key 20 in a forceful manner or a lightly-touch manner). Moreover, any variations in the compressed capacitance caused by decay of the capacitive structure of the capacitive element ($C_{sensor}$) 102 or by various other factors would also be reflected in the waveform of the keystroke mode description signal $V_{press}$.

In theory, the user's each key-pressing action would normally includes an initial stage of static contact with the key 20 (i.e., the user's finger is simply placed on the key 20 without exerting down-pressing force); and when the key 20 is pressed by the user for data input, the user's key-pressing action would normally include a first stage of acceleration (the user's finger starts to exert force on the key 20), a second stage of pause when the key 20 is pressed to the extreme of the user's habitual key-pressing action, and a third stage of withdrawing the finger to release the key 20. As a result, as depicted in FIG. 6, the keystroke mode description signal $V_{press}$ will include a falling-edge portion 201 corresponding to the first stage of the user's key-pressing action, a valley portion 202 corresponding to the second stage of the user's key-pressing action, and a rising-edge portion 203 corresponding to the third stage of the user's key-pressing action.

In reality, a small amount of capacitive effect would be induced by the user's finger even though the finger is separated from the key 20 by a small space without physically touching the key 20. This kind of induced capacitive effect would be reflected and included in the falling-edge portion 201 of the keystroke mode description signal $V_{press}$.

In practice, the keystroke mode detection module 110 includes: (B1) a capacitive frequency signal extraction circuit 111; (B2) a signal sampling circuit 112; and (B3) a low-pass filter circuit 113.

The capacitive frequency signal extraction circuit 111 is used to extract a capacitive frequency signal (which can be either $S_{RO}$ or $S_{RC}$) from the capacitive keystroke-sensing module 101. The signal sampling circuit 112 is capable of performing a sampling operation on the extracted capacitive frequency signal ($S_{RO}$ or $S_{RC}$) to thereby produce the keystroke mode description signal $V_{press}$. Further, since the output of the signal sampling circuit 112 would usually contain noises, it is subsequently processed by the low-pass filter circuit 113 to obtain a low-noise version of $V_{press}$ for further processing by the signal differentiation module 120.

Signal Differentiation Module 120

The signal differentiation module 120 is capable of performing a differentiation operation on the keystroke mode description signal $V_{press}$ generated by the keystroke mode detection module 110 to thereby produce a differential signal $V_{dif}$. As illustrated in FIG. 6, the waveform of this differential signal $V_{dif}$ includes an upward-going pulse 301 corresponding to the falling-edge portion 201 of $V_{press}$, a substantially flat portion 302 corresponding to the valley portion 202 of $V_{press}$, and a downward-going pulse 303 corresponding to the rising-edge portion 203 of $V_{press}$.

In practice, for example, the signal differentiation module 120 can be implemented with a high-pass filter circuit; but various other types of functionally-equivalent circuits can also be used.

Negative-Slope Detection Module 130

The negative-slope detection module 130 is capable of performing a negative-slope detection operation on the differential signal $V_{dif}$ generated by the signal differentiation module 120 to thereby determine its maximum amplitude $V_{max}$ corresponding to the maximum extent of the user's key-pressing action. As illustrated in FIG. 6, the maximum amplitude $V_{max}$ of $V_{dif}$ appears at a turning point of the waveform from positive slope to negative slop. This maximum amplitude $V_{max}$ corresponds to the minimum value of the compressed capacitance ($C_{min}$) of the capacitive element ($C_{sensor}$) 102 that is reached at the maximum extent of the user's key-pressing action.

In practice, since the slope changes from positive to negative at the maximum amplitude $V_{max}$, the resultant $V_{max}$ is also negative in value. For convenience in calculation, we can use the absolute value of $V_{max}$ in subsequent steps of computation.

Triggering Threshold Setting Module 140

The triggering threshold setting module 140 is capable of setting a triggering threshold $C_{th}$ based on the minimum value of the compressed capacitance (represented by $C_{min}$) corresponding to the maximum amplitude $V_{max}$ determined by the negative-slope detection module 130. Two examples are used in the following to explain the operation of the triggering threshold setting module 140.

In the first example, it is assumed that the RO-based capacitive keystroke-sensing module 101 has a rated capacitance $C_{rated}$ of 100 pf (which is the capacitance of the capacitive element ($C_{sensor}$) 102 when unpressed by the user), and that when the user's finger 30 presses down against the key 20, it causes the capacitance of the capacitive element ($C_{sensor}$) 102 to reach a minimum level of 10 pf. In this case, we can set the triggering threshold $C_{th}$ at 25 pf.

In the second example, it is assumed that the rated capacitance $C_{rated}$ is 80 pf, and that the user's key-pressing action causes the compressed capacitance to reach a minimum level of 60 pf. In this case, we can set the triggering threshold $C_{th}$ at about 65 pf.

Therefore, fundamentally we can devise a rule for setting the triggering threshold $C_{th}$ by first determining the difference between $C_{rated}$ and $C_{min}$, and then setting the triggering threshold $C_{th}$ by adding a fraction of the difference, such as ¼, ⅕, or ⅙, to $C_{min}$; i.e., $C_{th}=C_{min}+Y*(C_{rated}-C_{min})$, where Y is a predetermined fraction, preferably in the interval $0<Y<½$.

Key Strobe Signal Generation Module 150

After the triggering threshold $C_{th}$ is set, the key strobe signal generation module 150 is capable of comparing the resultant capacitance $C_{pressed}$ from each of the user's subsequent key-pressing actions against the triggering threshold $C_{th}$. In practice, this comparison is implemented by checking the frequency of the capacitive frequency signal $S_{RO}/S_{RC}$. If $C_{pressed}$ is above $C_{th}$ ($C_{pressed}>C_{th}$), it is judged that the user didn't intend to press down the associated key 20, and consequently no key strobe signal (TR) 402 is issued. On the other hand, if $C_{pressed}$ reaches down below $C_{th}$ ($C_{pressed}\leq C_{th}$), it is judged that the user intends to press down the associated key 20, and consequently the key strobe signal generation module 150 is activated to issue a key strobe signal (TR) 402 to the electronic unit 10 for data input of the associated key code.

Operation of the Invention

The following is a detailed description of a practical application example of the capacitive keyboard device of the invention 100 during actual operation.

When the user touches the key 20 for data input to the electronic unit 10 for the first time during each use, it will cause the keystroke mode detection module 110 to generate a keystroke mode description signal $V_{press}$ whose waveform includes a falling-edge portion 201 corresponding to the first stage of the user's key-pressing action when the capacitance is gradually compressed by the user's key-pressing action, a valley portion 202 corresponding to the second stage when the user stops to exert force on the key 20 and is ready to withdraw his/her finger 30, and a rising-edge portion 203 corresponding to the third stage when the key 20 is being released.

Subsequently, the signal differentiation module 120 is activated to perform a differentiation operation on the keystroke mode description signal $V_{press}$ to thereby produce a differential signal $V_{dif}$ whose waveform includes an upward-going pulse 301 corresponding to the falling-edge portion 201 of $V_{press}$, a substantially flat portion 302 corresponding to the valley portion 202 of $V_{press}$, and a downward-going pulse 303 corresponding to the rising-edge portion 203 of $V_{press}$.

Next, the negative-slope detection module 130 is activated to perform a negative-slope detection operation on the differential signal $V_{dif}$ to thereby determine its maximum amplitude $V_{max}$ corresponding to the maximum extent of the user's key-pressing action. As illustrated in FIG. 6, the maximum amplitude $V_{max}$ of $V_{dif}$ appears at a turning point of the waveform from positive slope to negative slop. This maximum amplitude $V_{max}$ corresponds to the minimum value of the compressed capacitance ($C_{min}$) of the capacitive element ($C_{sensor}$) 102 that is reached at the maximum extent of the user's key-pressing action.

Subsequently, the triggering threshold setting module 140 is activated to set a triggering threshold $C_{th}$ based on the difference between the rated capacitance $C_{rated}$ and the minimum compressed capacitance $C_{min}$; i.e., $C_{th}=C_{min}+Y*(C_{rated}-C_{min})$, where Y is a predetermined fraction, preferably in the interval $0<Y<½$.

Afterwards, when the user press the key 20, the key strobe signal generation module 150 will compare the resultant capacitance $C_{pressed}$ from each of the user's subsequent key-pressing actions against the triggering threshold $C_{th}$. If $C_{pressed}$ is above $C_{th}$ ($C_{pressed}>C_{th}$), it is judged that the user didn't intend to press down the associated key 20; and consequently, no key strobe signal (TR) 402 is issued. On the other hand, if $C_{pressed}$ reaches down below $C_{th}$ ($C_{pressed}<C_{th}$), it is judged that the user intends to press down the associated key 20; and consequently, the key strobe signal generation module 150 is activated to issue a key strobe signal (TR) 402 to the electronic unit 10 for data input of the associated key code.

In conclusion, the invention provides a capacitive keyboard device which is characterized by the operation of a triggering threshold adaptive adjustment function that can adaptively adjust the keystroke triggering threshold of the capacitive keyboard device in response to the user's habitual key-pressing action during each use, which also takes account of all internal factors (such as decay of the capacitor structure) and external factors (such as physical characteristics of the user's fingers). This feature allows the capacitive keyboard device to be reliable in operation for long period of use. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A capacitive keyboard device for integration to an electronic unit, which comprising:

a capacitive keystroke-sensing module having a capacitive element, which is capable of responding to a user-initiated keystroke event by generating a capacitive frequency signal;

a keystroke mode detection module, which is capable of processing the capacitive frequency signal extracted from the capacitive keystroke-sensing module to thereby produce a keystroke mode description signal which includes a falling-edge portion, a valley portion, and a rising-edge portion;

a signal differentiation module, which is capable of performing a differentiation operation on the keystroke mode description signal generated by the keystroke mode detection module to thereby produce a differential signal whose waveform includes an upward-going pulse corresponding to the falling-edge portion of the keystroke mode description signal, a substantially flat portion corresponding to the valley portion of the keystroke mode description signal, and a downward-going pulse corresponding to the rising-edge portion of the keystroke mode description signal;

a negative-slope detection module, which is capable of performing a negative-slope detection operation on the output differential signal of the signal differentiation module to thereby determine the minimum compressed capacitance corresponding to the maximum amplitude of the differential signal;

a triggering threshold setting module, which is capable of setting a triggering threshold for the capacitive keyboard device, where the triggering threshold is a predetermined level between the rated capacitance of the capacitive element and the minimum compressed capacitance determined by the negative-slope detection module; and a key strobe signal generation module, which is capable of operating after the triggering threshold is set by comparing each subsequent capacitive frequency signal generated by the capacitive keystroke-sensing module against the triggering threshold, in such a manner that a key strobe signal is issued if the resultant compressed capacitance reaches below the triggering threshold; and otherwise, no key strobe signal is issued.

2. The capacitive keyboard device as recited in claim 1, wherein the capacitive keystroke-sensing module is implemented with a relaxation oscillator (RO) based type of capacitive keystroke-sensing circuit.

3. The capacitive keyboard device as recited in claim 1, wherein the capacitive frequency signal extracted from the capacitive keystroke-sensing module is an RO (relaxation oscillation) induced frequency signal.

4. The capacitive keyboard device as recited in claim 1, wherein the capacitive frequency signal extracted from the capacitive keystroke-sensing module is an RC (resistor-capacitor) circuit induced frequency signal.

5. The capacitive keyboard device as recited in claim 1, wherein the keystroke mode detection module includes a low-pass filter circuit for providing a noise-reduction low-pass filtering operation on the capacitive frequency signal.

6. The capacitive keyboard device as recited in claim 1, wherein the signal differentiation module is implemented with a high-pass filter.

* * * * *